US009536748B2

(12) United States Patent
Berry, III et al.

(10) Patent No.: US 9,536,748 B2
(45) Date of Patent: Jan. 3, 2017

(54) USE OF ION BEAM ETCHING TO GENERATE GATE-ALL-AROUND STRUCTURE

(71) Applicant: Lam Research Corporation, Fremont, CA (US)

(72) Inventors: Ivan L. Berry, III, San Jose, CA (US); Thorsten Lill, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/520,070

(22) Filed: Oct. 21, 2014

(65) Prior Publication Data

US 2016/0111294 A1    Apr. 21, 2016

(51) Int. Cl.

| H01L 21/336 | (2006.01) |
|---|---|
| H01L 21/3065 | (2006.01) |
| H01L 29/06 | (2006.01) |
| H01L 29/423 | (2006.01) |
| H01L 29/786 | (2006.01) |

(Continued)

(52) U.S. Cl.
CPC ....... *H01L 21/3065* (2013.01); *H01J 37/3023* (2013.01); *H01J 37/3056* (2013.01); *H01L 21/308* (2013.01); *H01L 29/0673* (2013.01); *H01L 29/42392* (2013.01); *H01L 29/66439* (2013.01); *H01L 29/66742* (2013.01); *H01L 29/775* (2013.01); *H01L 29/786* (2013.01);
(Continued)

(58) Field of Classification Search
CPC ............ H01L 29/42392; H01L 29/775; H01L 29/66439;H01L 29/0673; H01L 21/3065; H01L 21/67069
See application file for complete search history.

(56) References Cited

U.S. PATENT DOCUMENTS 3,704,511 A    12/1972  Hooker
3,899,711 A     8/1975  Lemmond
(Continued)

FOREIGN PATENT DOCUMENTS

| CA | 1157511 | 11/1983 |
|---|---|---|
| CA | 1184239 | 3/1985 |
| WO | WO 2013/012620 | 1/2013 |

OTHER PUBLICATIONS

U.S. Appl. No. 14/592,820, filed Jan. 8, 2015, entitled "ION Beam Etch Without Need for Wafer Tilt or Rotation."
(Continued)

*Primary Examiner* — Jesse Y Miyoshi
(74) *Attorney, Agent, or Firm* — Weaver Austin Villeneuve & Sampson LLP

(57) ABSTRACT

Various embodiments herein relate to methods and apparatus for performing anisotropic ion beam etching to form arrays of channels. The channels may be formed in semiconductor material, and may be used in a gate-all-around device. Generally speaking, a patterned mask layer is provided over a layer of semiconductor material. Ions are directed toward the substrate while the substrate is positioned in two particular orientations with respect to the ion trajectory. The substrate switches between these orientations such that ions impinge upon the substrate from two opposite angles. The patterned mask layer shadows/protects the underlying semiconductor material such that the channels are formed in intersecting shadowed regions.

29 Claims, 7 Drawing Sheets

(51) Int. Cl.
  *H01L 29/66*   (2006.01)
  *H01L 21/308*  (2006.01)
  *H01J 37/305*  (2006.01)
  *H01J 37/302*  (2006.01)
  *H01L 29/775*  (2006.01)

(52) U.S. Cl.
  CPC .............. *H01J 2237/30472* (2013.01); *H01J 2237/3174* (2013.01)

(56) References Cited

U.S. PATENT DOCUMENTS

| | | |
|---|---|---|
| 4,200,794 A | 4/1980 | Newberry et al. |
| 4,419,580 A | 12/1983 | Walker et al. |
| 6,617,595 B1 | 9/2003 | Okunuki |
| 7,037,846 B2 | 5/2006 | Srivastava et al. |
| 7,416,989 B1 | 8/2008 | Liu et al. |
| 7,977,249 B1 | 7/2011 | Liu et al. |
| 7,981,763 B1 | 7/2011 | van Schravendijk et al. |
| 8,058,179 B1 | 11/2011 | Draeger et al. |
| 8,187,486 B1 | 5/2012 | Liu et al. |
| 8,608,973 B1 | 12/2013 | Guha |
| 8,617,411 B2 | 12/2013 | Singh |
| 2007/0063337 A1* | 3/2007 | Schubert ............... H01L 23/473 257/714 |
| 2015/0311292 A1* | 10/2015 | Srinivasan .......... H01L 29/0684 257/190 |
| 2016/0049281 A1 | 2/2016 | Berry, III et al. |
| 2016/0064232 A1 | 3/2016 | Berry, III et al. |
| 2016/0064260 A1 | 3/2016 | Berry, III et al. |

OTHER PUBLICATIONS

U.S. Appl. No. 14/473,863, filed Aug. 29, 2014, entitled "ION Injector and Lens System for ION Beam Milling."

U.S. Appl. No. 14/458,161, filed Aug. 12, 2014, entitled "Differentially Pumped Reactive Gas Injector."

U.S. Appl. No. 15/054,023, filed Feb. 25, 2016, entitled "ION Beam Etching Utilizing Cryogenic Wafer Temperatures".

U.S. Appl. No. 13/908,676, filed Jun. 3, 2013, entitled "Temperature Controlled Substrate Support Assembl".

U.S. Appl. No. 15/351,882, filed Nov. 15, 2016, entitled "Selective Use of Ion Beam Etching to Generate Gate-All-Around Structure."

* cited by examiner

USE OF ION BEAM ETCHING TO GENERATE GATE-ALL-AROUND STRUCTURE

BACKGROUND

Integrated circuits continue to be fabricated at increasingly smaller dimensions. However, the small size of certain semiconductor devices, such as field-effect transistors (FETs), leads to certain problems. For instance, a short channel length can result in short-channel effects where the source and/or drain regions exert undue influence over the channel or carriers in the channel. These short-channel effects can lead to a reduced ability of a gate to exercise control over the channel. Advantageously, these effects are reduced when 3D devices are used in place of planar devices. For instance, where a fin type field-effect transistor (FinFET) is used, a gate has increased control over the channel because the gate wraps around three of the four sides of the channel (i.e., the gate contacts two lateral surfaces of the channel and the top surface of the channel). Similarly, a gate-all-around (GAA) structure achieves improved control by wrapping the gate material around all sides of the channel. By surrounding the channel in this manner, the gate can exert tighter control over the channel and thereby modulate the on/off states of the device more reliably.

SUMMARY

Certain embodiments herein relate to methods and apparatus for forming channels in a gate-all-around device. The channels may be formed in an array having several rows of channels. Reactive ion beam etching or chemically assisted ion beam etching may be used in various cases.

In one aspect of the embodiments herein, a method is provided for forming channels or nanowires for a gate-all-around device or other electronic device, the method including: (a) providing a substrate on a substrate holder in a reaction chamber, the substrate including a patterned mask layer over semiconductor material, where the patterned mask layer includes a plurality of linear mask portions oriented substantially parallel to one another; (b) orienting the substrate with respect to an ion trajectory in a first orientation and directing ions toward the substrate in a first direction, where the ions impact the substrate at a first incidence angle to thereby anisotropically etch the semiconductor material to form a first set of etched trenches; (c) orienting the substrate with respect to the ion trajectory in a second orientation and directing the ions toward the substrate in a second direction, where the ions impact the substrate at a second incidence angle to thereby anisotropically etch the semiconductor material to form a second set of trenches; (d) repeating (b)-(c) to further etch the first and second sets of trenches to form the channels or nanowires in a direction parallel to the plurality of linear mask portions.

In various embodiments, an array of channels is formed and the array of channels includes one or more rows of channels, for example two or more rows of channels. The ions may be delivered in ion beams that may be set to a particular divergence. In some embodiments, the ion beams have a divergence of about 3° or less. In a certain case, the ion beams have a divergence of about 1° or less, and an array of channels or nanowires is formed, the array including at least three rows of channels or nanowires.

The method may also include translating the substrate while the ions are exposed to the substrate in (b) and/or (c).

In some cases, the method may also include ceasing the flux of ions while the substrate is switching orientations with respect to the ion trajectory.

The ions may be directed toward the substrate at particular angles. In various cases, the first direction and second direction are each perpendicular to the length of the linear mask portions. The first direction and second direction may be substantially opposite one another. In some cases, the first and second incidence angles are substantially equal and opposite one another.

The etching may occur through a number of different reaction mechanisms. In some cases, the method includes delivering a reactive etchant to the surface of the substrate during (b) and during (c). For instance, the reactive etchant may include a gas selected from the group consisting of $H_2$, $O_2$, $H_2O$, $F_2$, $CH_4$, $CF_4$, $C_2F_6$, $BF_3$, $NH_3$, NO, $NO_2$, $SF_6$, $N_2$, $N_2O$, $BCl_3$, $CHF_3$, $CH_2F_2$, $C_2H_4Cl_2$, HCl, $Cl_2$, $Br_2$, HBr, methanol, ethanol, propanol, butanol, methylene glycol, ethylene glycol, acetylacetone, acetic acid, formic acid, hexafluoroacetylacetone, ketones, amines, esters, and combinations thereof. In certain embodiments, the reactive etchant includes ions of a material selected from the group consisting of: H, O, F, Cl, Br, I, $BF_2$, $BCl_2$, and combinations thereof.

The reactive etchant may be provided along with an inert gas, where the inert gas is used to generate a plasma from which the ions are extracted. In certain embodiments, (b) and (c) each include cyclically performing the steps of: delivering the reactive etchant to the surface of the substrate, and exposing the surface of the substrate to the ions. The cycles may be repeated during etching. For example, in some cases, at least two cycles of reactant delivery and ion exposure are performed each time the substrate switches orientations with respect to the ion trajectory. In these or other embodiments, the orientation of the substrate with respect to the ion trajectory may switch 2 or more times during formation of the channels. In certain cases the orientation of the substrate with respect to the ion trajectory may switch 5 or more times, for example 10 or more times, during formation of the channels. Orienting the substrate with respect to the ion trajectory in (b) and/or (c) may include (i) changing the orientation of the substrate and/or (ii) changing the orientation of the ion trajectory.

A number of additional processing steps may be undertaken to form the channels or nanowires and/or to form the gate-all-around device or other electronic device. In some embodiments, the method includes after (d), etching the channels or nanowires to make the channels or nanowires more round. The method may also include removing the patterned mask layer; depositing sacrificial material surrounding the channels; performing an isotropic etch to remove additional semiconductor material positioned under the channels, and performing an etch to remove the sacrificial material surrounding the channels. In some embodiments, after the sacrificial material is removed, dielectric material may be deposited to coat the channels. The method may further include depositing a gate structure around the coated channels to form a gate-all-around device.

In another aspect of the disclosed embodiments, an apparatus for forming channels or nanowires for a gate-all-around device or another electronic device on a semiconductor substrate is provided, the apparatus including: a reaction chamber; a plasma source; a substrate support configured to position the substrate in at least a first position and a second position, the substrate including semiconductor material under a patterned mask layer including a plurality of linear mask portions; and a controller including instructions for: (a) orienting the substrate with respect to an ion trajectory in the first position and directing ions toward the substrate in a first direction, where the ions impact the substrate at a first incidence angle to thereby anisotropically etch the semiconductor material on the substrate to form a first set of trenches; (b) orienting the substrate with respect to the ion trajectory in the second position and directing the ions toward the substrate in a second direction, where the ions impact the substrate at a second incidence angle to thereby anisotropically etch the semiconductor material to form a second set of trenches; (c) repeating (a)-(b) to further etch the first and second sets of trenches to form the channels in a direction parallel to the plurality of linear mask portions.

The controller may further have instructions to perform any of the methods disclosed herein. In certain embodiments, the apparatus further includes a plurality of electrodes positioned in the reaction chamber, each of the electrodes having a plurality of apertures.

In a further aspect of the disclosed embodiments, a method of forming channels or nanowires for a gate-all-around device or other electronic device is provided, the method including: (a) providing a substrate on a substrate holder in a reaction chamber, the substrate including a patterned mask layer over semiconductor material, where the patterned mask layer includes a plurality of linear mask portions oriented substantially parallel to one another; (b) orienting the substrate with respect to an ion trajectory in a first position and directing ions toward the substrate in a first direction, the plurality of linear mask portions protecting a plurality of first shadowed regions, where the ions impact the substrate at a first incidence angle to thereby etch the semiconductor material to form a first set of trenches between adjacent first shadowed regions; (c) orienting the substrate with respect to the ion trajectory in a second position and directing the ions toward the substrate in a second direction, the plurality of linear mask portions protecting a plurality of second shadowed regions, where the ions impact the substrate at a second incidence angle to thereby etch the semiconductor material to form a second set of trenches between adjacent second shadowed regions; (d) repeating (b)-(c) to further etch the first and second sets of trenches, where the first and second set of trenches intersect with one another, where the first shadowed regions and second shadowed regions intersect with one another, and where the channels or nanowires are formed in a direction parallel to the plurality of linear mask portions, in areas where the first and second shadowed regions intersect with one another.

These and other features will be described below with reference to the associated drawings.

DETAILED DESCRIPTION

Figure 1:
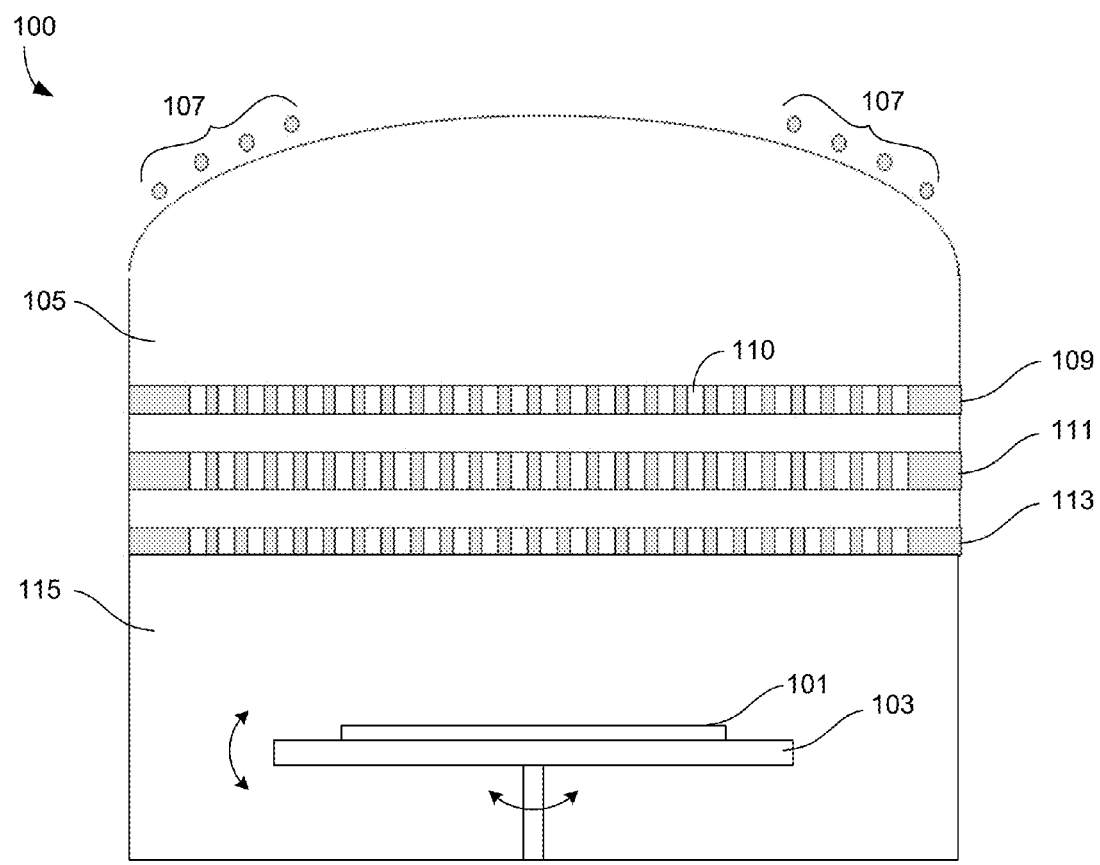
FIG. 1 provides a simplified view of an ion beam etching chamber that may be used in certain embodiments.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, electro-optical devices, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Gate-all-around (GAA) structures provide a promising pathway for increasing circuit density in integrated circuits, especially compared to 2D field effect transistors (FETs). Current methods for forming GAA structures rely on selective isotropic etching to undercut lithographically defined lines. The methods disclosed herein utilize high angle anisotropic etching using reactive ion beam etching or chemically assisted ion beam etching to form such structures. One advantage of the disclosed methods is the ability to generate densely stacked arrays of conductors (which act as channels), thereby significantly increasing the density of a device.

In various embodiments herein, channels and arrays of channels for GAA structures are formed through reactive ion beam etching. By using an appropriate mask and etching from particular tilt angles and rotation angles, such channels can be directly etched into a desired material.

Ion beam etching has been used in fabrication of semiconductor devices. It involves removing material from the surface of a substrate by delivering energetic ions to the substrate surface. Ion beam etching may be broadly divided into processes that solely involve inert ions (e.g., argon ions), and processes that involve reactive ions or chemical reactions initiated by ions (e.g., oxygen ions, certain ionized compounds such as fluorine-containing ionized compounds, reactive or inert ions initiating a chemical reaction with a reactant chemisorbed or physisorbed on the surface on the substrate, etc.). In these processes, ions impinge on the substrate surface and remove material through either direct physical momentum transfer (sputtering) or a chemical reaction initiated by the energy transfer from the ions (reactive ion beam etching or chemically assisted ion beam etching). Reactive ion beam etching (RIBE) typically involves utilization of an ion that can chemically react with the substrate (such as oxygen, fluorine, and the like). In chemically assisted ion beam etching (CAIBE), an inert ion either initiates a chemical reaction between the substrate and a reactant (such as an applied gas that is adsorbed on the surface), or generates a reactive site on the surface of the substrate that reacts with an applied reactant coincident with or subsequent to the generation of the reactant site, or any combination thereof.

One factor that affects the quality of the etching results is the ability to control the energy and angle at which the ions impact the surface (i.e., the angle of incidence). These factors are important in forming features having desired dimensions and profiles. Ion beam etching may be especially useful in fabricating GAA devices due to the ability to control the angle (including tilt angle and rotational angle) at which ions impinge upon the substrate, as described herein.

FIG. 1 presents a simplified cross-sectional view of an apparatus 100 for performing ion beam etching according to certain methods. In this example, substrate 101 rests on substrate support 103, which may be equipped with hardware (not shown) to provide electrical and fluidic connections. The electrical connections may be used to supply electricity to the substrate support 103 or to an electrostatic chuck located on or within the substrate support 103 (not shown) in some cases, while the fluidic connections may be used to provide fluids used to control the temperature of the substrate 101 and substrate support 103. The substrate support 103 may be heated by a heater (not shown) or cooled by a cooling mechanism (not shown). The cooling mechanism may involve flowing cooling fluids through piping in or adjacent the substrate support 103. The substrate support 103 may be capable of rotating and tilting at variable speeds and angles, as indicated by the double headed arrows in FIG. 1. In the embodiments herein, the substrate support 103 is also capable of positioning the substrate at very precise locations and orientations. In other words, not only can the substrate support 103 tilt and rotate the substrate, it can reliably tilt and rotate the substrate to particular tilt angles and rotation angles as desired.

Further, the substrate support 103 may be configured to translate a substrate in certain embodiments. For instance, the substrate support may translate the substrate back and forth in any direction within the plane of the substrate and raise or lower the substrate with respect to the ion source or tilt the substrate with respect to the ion source. An apparatus having a substrate support that can translate the substrate in this manner may be particularly beneficial for forming GAA structures because translation may allow for processing with more highly collimated beams, which are better at etching large arrays of channels. In many prior ion beam etching applications, the ion beams are designed to be slightly divergent such that the beams, when taken together, deliver ions to the entire surface of the substrate. Where more highly collimated beams are used, such beams may fail to deliver ions uniformly to certain portions of the substrate surface. Substrate rotation is often used to average out these spatial effects and more uniformly distribute the ions over the substrate surface. This rotation however causes the ion incidence angles with respect to the features on the substrate to vary continuously as the substrate rotates. However, in various embodiments disclosed herein, it is desired that the ion beams are very highly collimated (i.e., have very low divergence) and strike features on the substrate at specific angles. Such highly collimated beams are better at forming the arrays of channels. By translating the substrate, ions can be delivered to the entire surface of the substrate without having to use divergent ion beams.

A plasma generation gas is delivered to a primary plasma generation region 105. The plasma generation gas is energized by a plasma source 107. In the context of FIG. 1, the plasma source 107 is a coil that acts as an inductively coupled plasma source. Other sources such as capacitively coupled sources, microwave sources or discharge sources may be employed in appropriately designed reactors. Plasma forms in the primary plasma generation region 105. An extraction electrode 109 includes a series of apertures 110 through which ions are extracted.

The apertures 110 may have a diameter between about 0.5-1 cm, and a height that is defined by the thickness of the electrode. The apertures 110 may have a height to width aspect ratio (AR) between about 0.01-100.0. In some cases the apertures 110 are arranged in a hexagonal, square grid, or spiral pattern, though other patterns may be used as well. A center-to-center distance between neighboring apertures may be between about 1 mm-10 cm. The apertures may be configured to achieve an overall open area (i.e., sum of the area of each aperture) that is between about 0.1%-95% of the surface area of the electrode when considering only a single (top or bottom) face of the electrode. For example, an electrode having a diameter of 40 cm and 500 holes each having a diameter of 1 cm will have an open area of about 31% (393 cm$^2$ open area divided by 1257 cm$^2$ total area). The apertures 110 may have different diameters in different electrodes. In some cases, the aperture diameter is smaller in upper electrodes and larger in lower electrodes. In one embodiment, the apertures in a lower electrode 113 are larger than the apertures in a focus electrode 111 (e.g., between about 0-30% larger). In these or other cases, the apertures in the focus electrode 111 may be larger than the apertures in the extraction electrode 109 (e.g., between about 0-30% larger).

The bias $V_1$ applied to the extraction electrode 109 with respect to the substrate 101 acts to provide kinetic energy to the ion with respect to the substrate. This bias is generally positive and can range between about 20-10,000 volts or more. In certain cases the bias on the extraction electrode is between about 20-2,000 volts. Positive ions in the plasma above extraction electrode 109 are attracted to the lower electrode 113 by the potential difference between electrodes 109 and 113. Focus electrode 111 is added to focus the ions, and if needed, repel electrons. A bias $V_2$ on this electrode can be either positive or negative with respect to the extraction electrode 109, but is generally biased negatively. The bias potential of focus electrode 111 is determined by the lensing characteristics of the focusing electrode 111. Bias voltages on the focus electrode include positive voltages between about 1.1× to 20× the potential $V_1$ on the extraction electrode, and negative voltages having a magnitude between about 0.001× to 0.95× the potential of $V_1$. Due to the different potentials applied to the different electrodes, a potential gradient exists. The potential gradient may be on the order of about 1000 V/cm. Example separation distances between neighboring electrodes fall between about 0.1-10 cm, or for example about 1 cm.

After the ions leave the bottom of the grounded lower electrode 113, they travel in a collimated and focused beam if the focus electrode 111 voltage is set to produce a collimated beam. Alternatively the beam can be made divergent if the focus electrode voltage is adjusted to either under- or over-focus the ion beam. The use of a highly collimated beam is particularly useful in forming GAA structures as disclosed herein. The lower electrode 113 is grounded in many (but not all) cases. The use of a grounded lower electrode 113 in combination with a grounded substrate 101 results in a substrate processing region 115 that is substantially field free. Having the substrate located in a field-free region prevents electrons or secondary ions generated by collisions between the ion beam with residual gases or with surfaces in the reaction chamber from being accelerated towards the substrate, thereby minimizing the risk of causing unwanted damage or secondary reactions. In other cases, the lower electrode 113 and substrate 101 may both be biased, as discussed further below.

Additionally, it is important to prevent the substrate 101 from charging from the ion beam itself, or from ejected secondary electrons generated during the ion beam collision with the substrate. Neutralization is typically accomplished by adding a low energy electron source (not shown) in the vicinity of the substrate 101. Since the positive charge on the ion and the ejected secondary electrons both charge the substrate positively, low energy electrons in the vicinity of the substrate can be attracted to the positively charged surface and can neutralize this charge. Performing this neutralization is much easier in a field free region.

In some applications it may be desirable to have a potential difference between the lower electrode 113 and substrate 101. For example, if very low energy ions are required, it is difficult to maintain a well-collimated beam at low energy over long distances due to mutual repulsion of the positively charged ions (space-charge effects). One solution to this is to place a negative bias on the lower electrode 113 with respect to substrate 101 (or conversely biasing substrate 101 positively with respect to the lower electrode 113). This allows extracting the ions at higher energy, then slowing them down as they approach the substrate.

In certain ion beam etching operations, one of the three electrodes may be omitted. Where this is the case, there is less flexibility regarding the energy at which ions are directed to the surface of the substrate. This limitation arises because in order for the ions to be focused and directed as desired, a particular ratio of bias potentials should be applied to the two electrodes. The ratio of bias potentials is controlled by the focusing characteristics and geometries of the two electrodes. As such, where a particular geometry is used and a particular bias/electrical state is desired on the lower electrode (e.g., grounded), there is little or no flexibility in the bias applied to the upper electrode. The result is that a reaction chamber using such a setup is limited in the range of ion energy that may be imparted to ions as they travel through the various electrodes. The introduction of a third electrode allows the ions to be focused/directed as desired at many different ion energies, as described above.

Each of the electrodes 109, 111, and 113 has a thickness, which may be between about 0.5 mm-10 cm, or between about 1 mm-3 cm, for example about 5 mm. The electrodes 109, 111, and 113 may each be the same thickness, or they may have different thicknesses. Further, the separation distance between the extraction electrode 109 and the focus electrode 111 may be the same, greater, or less than the separation distance between the focus electrode 111 and the lower electrode 113. Each electrode 109, 111, and 113 also has dimensions, which may be less than, equal to or greater than the dimensions of the substrate being processed. In certain embodiments, the electrodes' dimensions are close to that of the substrate or substrate support (e.g., within about 50%).

The electrodes 109, 111, and 113, may be circular, rectangular or other polygonal shape. In certain embodiments the electrodes are long and narrow, wherein the long dimension is approximately equal to or greater than one dimension of the substrate, and the substrate is scanned in the orthogonal direction such that the ion beam strikes uniformly across the substrate surface when averaged over time.

The apertures 110 in the extraction electrode 109, focus electrode 111 and lower electrode 113 may be precisely aligned with one another. Otherwise, ions will be aimed incorrectly, and the on-wafer etching results will be poor. For instance, if a single aperture in the focus electrode 111 is misaligned, it may result in one area of the substrate 101 becoming over-etched (where too many ions are directed) and another area of the substrate 101 becoming under-etched (where no ions or too few ions are directed). As such, it is desirable for the apertures to be as aligned with one another as much as possible. In various cases the misalignment between vertically adjacent electrodes is limited to about 1% or less of the hole diameter (as measured by the distance of a linear shift in the position of the aperture as compared to the adjacent aperture).

Ion beam etching processes are typically run at low pressures. In some embodiments, the pressure may be about 100 mTorr or less, for example about 1 mTorr or less, and in many cases about 0.1 mTorr or less. The low pressure helps minimize undesirable collisions between ions and any gaseous species present in the substrate processing region.

Ion beam etching processes may be used for atomic layer etching processes in some embodiments. Atomic layer etching methods are further discussed in the following U.S. Patents, each of which is herein incorporated by reference in its entirety: U.S. Pat. No. 7,416,989, titled "ADSORPTION BASED MATERIAL REMOVAL PROCESS"; U.S. Pat. No. 7,977,249, titled "METHODS OF REMOVING SILICON NITRIDE AND OTHER MATERIALS DURING FABRICATION OF CONTACTS"; U.S. Pat. No. 8,187,486, titled "MODULATING ETCH SELECTIVITY AND ETCH RATE OF SILICON NITRIDE THIN FILMS"; U.S. Pat. No. 7,981,763, titled "ATOMIC LAYER REMOVAL FOR HIGH ASPECT RATIO GAPFILL"; and U.S. Pat. No. 8,058,179, titled "ATOMIC LAYER REMOVAL PROCESS WITH HIGHER ETCH AMOUNT." Various ion beam etching methods and apparatus are further discussed in U.S. patent application Ser. No. 14/473,863, filed Aug. 29, 2014, and titled "ION INJECTOR AND LENS SYSTEM FOR ION BEAM MILLING," and U.S. patent application Ser. No. 14/458,161, filed Aug. 12, 2014, and titled "DIFFERENTIALLY PUMPED REACTIVE GAS INJECTOR," each of which is herein incorporated by reference in its entirety.

Figure 2:
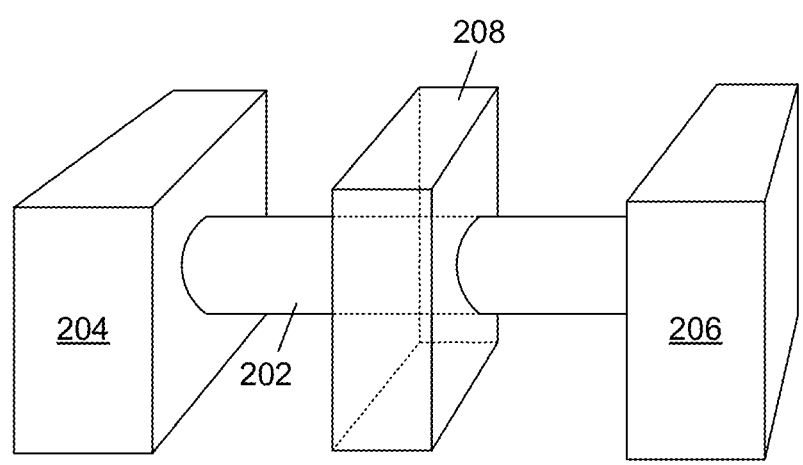
FIG. 2 illustrates a gate-all-around device.

FIG. 2 shows the basic structure of a GAA device 200 having a single channel 202. The channel 202 extends between the source region 204 and the drain region 206. Between the source region 204 and drain region 206 is a gate 208 that wraps around all sides of the channel 202. Not shown in FIG. 2 are dielectric materials surrounding the channel 202 and separating the channel 202 from the gate 208. In various cases, a GAA device includes multiple channels that are controlled by a single gate. The additional channels provide more current flow to allow the GAA device to have higher output current or higher energy.

In various embodiments herein, channels for a GAA structure are formed through a reactive ion beam etching (RIBE) or chemically assisted ion beam etching (CAIBE) process. The RIBE or CAIBE process may be used to create not only lines of channels, but arrays of channels that are several lines deep. After the RIBE or CAIBE, additional etching and deposition steps may be undertaken as described below to remove unwanted material and shape the channels as desired.

FIGS. 3A-3I present a process flow for forming an array of channels through a RIBE or CAIBE process according to various disclosed embodiments. The process begins at FIGS. 3A (top down view) and 3B (side view), where a patterned mask layer 301 is provided over semiconductor material 303, which is can be either an intrinsic or extrinsic semiconductor. The patterned mask layer 301 includes linear mask segments oriented substantially parallel to one another in a direction that the channels are to be formed. The semiconductor material 303 may be, for example, silicon, germanium, silicon germanium, indium, gallium, group 3 materials, group 5 materials, or a combination thereof. In certain cases, the field-effect device may have metallic or metal-like channels. The patterned mask layer 301 can be any appropriate mask material. In this particular example, the patterned mask layer 301 is silicon oxide. Shallow trench isolation (STI) material 305 may be provided as shown. Each individual linear mask segment of the patterned mask layer 301 acts to shadow underlying semiconductor material 303 during an etching process. The dimensions of the linear mask segments of the pattern mask layer 301 determine the dimensions of the resulting channels 302. In certain implementations, the linear mask segments have a width (measured left-right in FIGS. 3A and 3B) between about 5-200 nm, for example between about 10-40 nm. The linear mask segments may have a center-to-center separation (measured left-right in FIGS. 3A and 3B) between about 10-500 nm, for example between about 20-100 nm. The mask segments may have a height (measured up-down in FIG. 3B) between about 5-500 nm, for example between about 10-50 nm. The length of the linear mask segments (measured up-down in FIG. 3A) determines the length of the channels 302. In certain cases, the mask segments have a length between about 20-500 nm. These dimensions may result in channels 302 having a width between about 3-100 nm after processing (e.g., the channels 302 of FIG. 3I may be about 3-100 nm wide). The resulting channels are relatively small and densely packed.

Figure 3A:
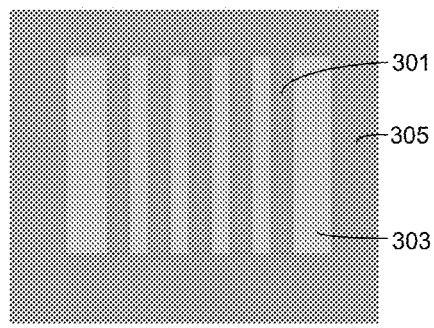
FIGS. 3A-3I depict a partially fabricated semiconductor device as it undergoes various processing steps for forming a gate-all-around device according to certain embodiments.
Figure 3B:
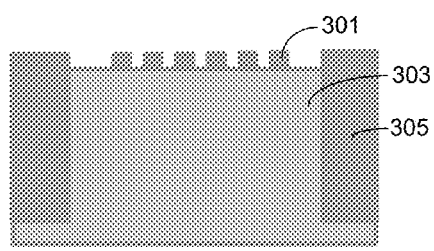
Figure 3C:
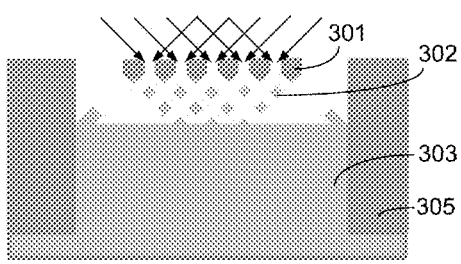

Next, a RIBE, or CAIBE process is performed to etch away the semiconductor material as shown in FIG. 3C. While continuous/uni-directional substrate rotation is used in many ion beam etching processes, a different approach is used in various disclosed embodiments. In order to form the channels as shown in FIG. 3C, the substrate switches between two orientations with respect to the ion trajectory, and ions primarily impinge upon the substrate while it is in one of these two orientations. In some cases the ions impinge upon the substrate only while it is in one of the two orientations. The arrows in FIG. 3C show the trajectory of the ions used to etch the semiconductor material. Two different ion trajectories are shown: one coming from the right and one coming from the left. At a given time during etching, only one of these two ion trajectories is present, as explained further with respect to FIGS. 4A-4D. These ion trajectories, taken together, etch the semiconductor material under the patterned mask layer 301 in a very specific way.

The flux of ions toward the substrate may be stopped or reduced while the substrate is changing orientations, such that ions only impinge upon the substrate when it is in one of the two desired orientations. In other cases the ion flux will continue while the substrate switches orientation, particularly if the switch occurs quickly compared to the time that the substrate spends in each orientation. These techniques help ensure that the ions only etch the semiconductor material in particular directions, such that the channels 302 can be formed. The channels 302 are formed to have a length that is parallel to the length of the patterned mask segments. In FIGS. 3C-3E and 3G-3I, the length of the channels extends into/out of the page.

In order to etch the channels to have a length oriented in this manner, the ions should be aimed at relatively high angles of incidence. Generally, two angles of incidence are used: one angle of incidence that etches the semiconductor material from a first side of the linear mask segments of the patterned mask layer 301, and a second angle of incidence that etches the semiconductor material from the opposite side of the linear mask segments. The incidence angle is measured as the angle between the ion trajectory and the normal of the substrate surface. For instance, if a substrate is maintained in a horizontal position and the ions impinge upon the surface in a direction directly downward/vertical, the incidence angle is 0°. If the substrate is tilted by 10° and the ions travel directly downward, the incidence angle is 10°.

In various embodiments both ion beam directions are perpendicular to the length of the linear mask segments of the patterned mask layer 301. The angles of incidence may be equal or unequal. In certain embodiments the angles of incidence are equal and opposite (e.g., +45° and −45° as viewed along the length of the patterned mask segments, as in FIG. 3C). In one embodiment, a first angle of incidence is 0° (such that the ion beam aims directly down onto the substrate, in line with the normal of the substrate), and a second or third angle of incidence is used to undercut the linear mask segments to form the channels. In this embodiment all the channels formed would be positioned vertically under the linear mask portions of the patterned mask layer. Different combinations of angles of incidence may be used to define the channels to have various contours and positions.

As mentioned, the flux of ions may be stopped or minimized while the substrate is not in a desired orientation. This may be accomplished by using a shutter that blocks the ions from hitting the substrate. The flux of ions may also be stopped or minimized by extinguishing the plasma. In other embodiments, an electrostatic field, a magnetic field, or both are used to deflect the ions away from imparting onto the substrate while the substrate orientation is being changed. In other cases, the flux of ions may remain constant, even while the substrate is switching orientations. Constant ion bombardment may be particularly useful in cases where the substrate switches orientations very quickly and/or where the substrate stays in a particular orientation for a relatively long time between orientation changes.

Figure 4A:
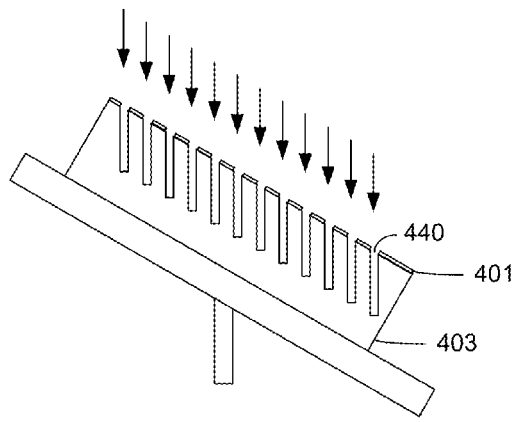
FIGS. 4A-4D illustrate a partially fabricated semiconductor device as it undergoes an anisotropic etching process to form channels for a gate-all-around device.

The anisotropic etching process is shown in greater detail in FIGS. 4A-4D. A substrate having a layer of semiconductor material 403 and an overlying patterned mask layer 401 is provided on a substrate support. The dimensions shown in FIGS. 4A-4D are greatly exaggerated to better illustrate the etching process. Further, various features (e.g., STI features) are omitted for clarity. The substrate begins an etching process in a first orientation, as shown in FIG. 4A. The ions (whose trajectory is represented by the arrows) impinge upon the surface in a first direction to form a first set of trenches 440. The ions may be inert ions (e.g., neon, argon, etc.), or they may be reactive ions. A reactant gas may be introduced to the reaction chamber during etching. In various embodiments the reactant gas may be added downstream of the electrodes (e.g., through an inlet below electrodes 109, 111 and 113 of FIG. 1). For instance, a secondary plasma source (e.g., ICP, TCP, or microwave plasma) may be provided to dissociate the reactant gas and form reactant radicals that can be fed into the reaction chamber below the lower electrode 113. The use of a secondary plasma source may be beneficial in enabling relatively lower pressure processing, which helps minimize unwanted collisions between ions and other species. The secondary plasma source (or other reactant source) may provide the reactant to the substrate surface through nozzles positioned close to (and optionally aimed at) the substrate surface. In another embodiment, the reactant is provided through the use of a scanning injection head, as discussed in U.S. patent application Ser. No. 14/458,161, incorporated by reference above. In other embodiments, the reactant may be provided together with an inert gas used to generate the ion beams (i.e., the reactant may be provided as part of a plasma generation gas delivered above the electrodes).

The reactant gas may be added coincident with ion bombardment or in an alternating/repeating cyclic fashion. Where the reactant gas is delivered in a coincident fashion, it may be provided separately as a background gas, or it may be provided as a part of a plasma generation gas, as noted above. Where the reactant is delivered in a cyclic fashion, the cycle may consist of the following steps: dose reactant into reaction chamber and allow reactant to adsorb onto substrate, optionally purge reactant from reaction chamber, optionally turn on ion beam, turn off ion beam. In certain embodiments the reactant gas includes $H_2$, $O_2$, $H_2O$, $F_2$, $CH_4$, $CF_4$, $C_2F_6$, $BF_3$, $NH_3$, NO, $NO_2$, $SF_6$, $N_2$, $N_2O$, $BCl_3$, $CHF_3$, $CH_2F_2$, $C_2H_4Cl_2$, HCl, $Cl_2$, Br2, HBr, methanol, ethanol, propanol, butanol, methylene glycol, ethylene glycol, acetylacetone, acetic acid, formic acid, hexafluoroacetylacetone, other ketones, other amines, other esters, or some combination thereof.

In a particular example, cyclic etching is performed using the following steps: (1) dose chlorine-containing etchant (e.g., $Cl_2$) into reaction chamber and allow etchant to adsorb onto substrate surface, thereby forming a layer of chlorinated semiconductor (e.g., SiCl, GeCl, SiGeCl, etc.); (2) optionally purge reaction chamber; (3) expose argon ion beams onto substrate surface to thereby remove the chlorinated semiconductor in areas where the ion beam impacts; (4) repeat (1)-(3); and (5) switch orientation of substrate with respect to the ion beam as described herein.

The pressure in the reaction chamber may be cycled in some cases such that the pressure is lower when the ion beams are on. Pressure cycling can help minimize unwanted ion collisions with background gases. In other cases the pressure in the reaction chamber remains constant. The use of a scanning injection head, which delivers reactant to a local area of the substrate at a local high pressure while maintaining a low background pressure, can help reduce or eliminate any need for pressure cycling.

Figure 4C:
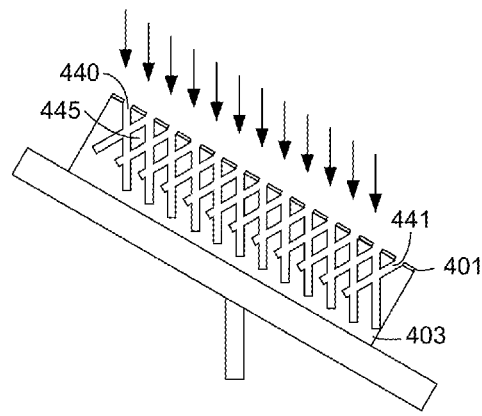
Figure 4B:
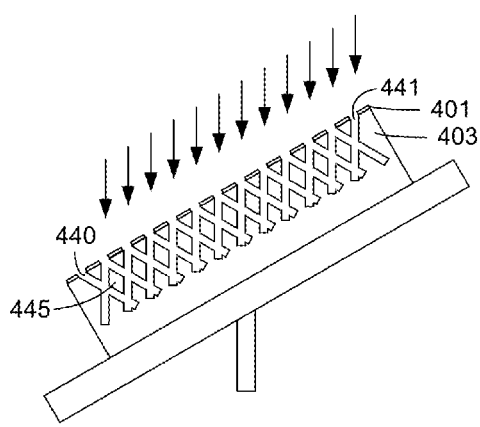
Figure 4D:
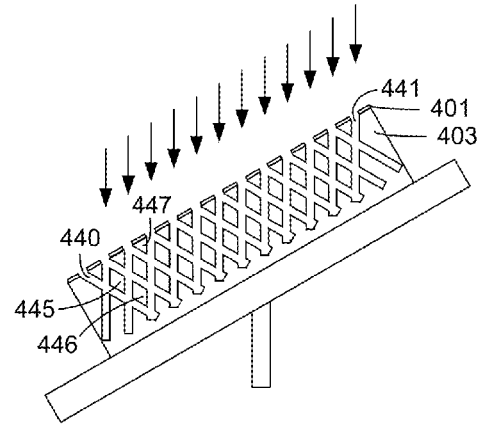

Returning to the embodiment of FIGS. 4A-4D, the substrate switches to a second orientation, as shown in FIG. 4B. As noted, the flux of ions may (or may not) be ceased or minimized while the substrate is switching orientations. Ion and reactant delivery may then continue as described above. Here, the ions impinge upon the substrate in a second direction to form a second set of trenches 441. The first and second directions may be on opposite sides of the wafer normal, and in some cases the two directions have substantially the same magnitude (as defined by the angle of incidence), as shown in FIG. 3C and FIGS. 4A-4D. The angles of incidence for the two directions may also be different in certain cases. The first set of trenches 440 and the second set of trenches 441 intersect with one another to leave a first layer of channels 445. Next, the substrate is switched back to its first orientation, as shown in FIG. 4C. Ions again impinge upon the substrate from the first direction to further etch the first set of trenches 440. Then, the substrate is switched back to the second orientation, as shown in FIG. 4D. Here, ions again impinge upon the substrate from the second direction to further etch the second set of trenches 441. The etched trenches 440 and 441 now intersect to form a second layer of channels 446. This process can be repeated to form an array having several layers of channels.

Directly underlying the patterned mask layer 401 is another layer of potential channels 447, as labeled in FIG. 4D. In some cases these potential channels 447 are formed into a layer of channels in a final device. In other cases these potential channels 447 may be removed during later processing steps.

In various implementations, the orientation of the substrate may switch several times during formation of each layer of channels. In other cases the orientation may switch less frequently. In embodiments where etching occurs through a cyclic process (e.g., atomic layer etching involving sequential delivery of a reactant and exposure to a plasma), several etching cycles may be performed before the substrate switches orientations. In some cases, between about 1-500 etching cycles (e.g., between about 2-50 cycles) are performed each time the substrate switches orientations. The number of times a substrate switches orientations may depend on several factors including the material being etched and the chemistry used to etch, plasma conditions, the number of cycles and/or time spent at each orientation, etc. In some cases, a substrate may switch orientations on the order of about 1-500 times, for example between about 2-100 times, or between about 4-50 times.

The disclosed methods can be used to form several rows of channels. The number of rows of channels formed may be between about 1-10, for example between about 1-4. In one embodiment only a single row of channels is formed, with each channel being directly under a protective mask. With respect to FIG. 4D, the single row of channels may be the potential channels 447. In other cases, at least about one row of channels, at least about two rows of channels, at least about three rows of channels, or at least about four rows of channels are formed (excluding the rows of potential channels 447 of FIG. 4D).

The number of rows of channels formed may depend on the divergence of the ion beam (less divergent beams can create a greater number of rows of channels). Beam divergence should be relatively small, for example less than about 5° for forming two rows of channels (not counting the potential channels 447 immediately under the mask layer), and less than about 3° for forming three rows of channels. As noted above, beam divergence in the disclosed embodiments may be lower than in many conventional applications. Whereas conventional applications typically use slightly divergent beams such that ions impinge upon the entire surface of the substrate, the ion beams in the present embodiments may be lower, with full ion coverage instead being provided through translation of the substrate. Substrate translation thus helps enable more collimated, less divergent ion beams, thereby enabling greater numbers of rows of channels to be formed.

In order to orient the substrate such that the ions impinge at the desired angles, the substrate support may be configured to accurately tilt and/or rotate the substrate. In one example, the substrate support tilts to a constant tilt angle (e.g., 45°), and then rotates the substrate at 180° intervals (e.g., in one direction, or back and forth) such that the ions hit the substrate at two opposite incidence angles (e.g., +45° and −45°). In another example, the substrate support tilts between two equal and opposite tilt angles (e.g., +45° and −45°), and no rotation is used. As noted, the substrate should be switched between two orientations such that the ions impinge upon the substrate from two equal and opposite angles.

Figure 6A:
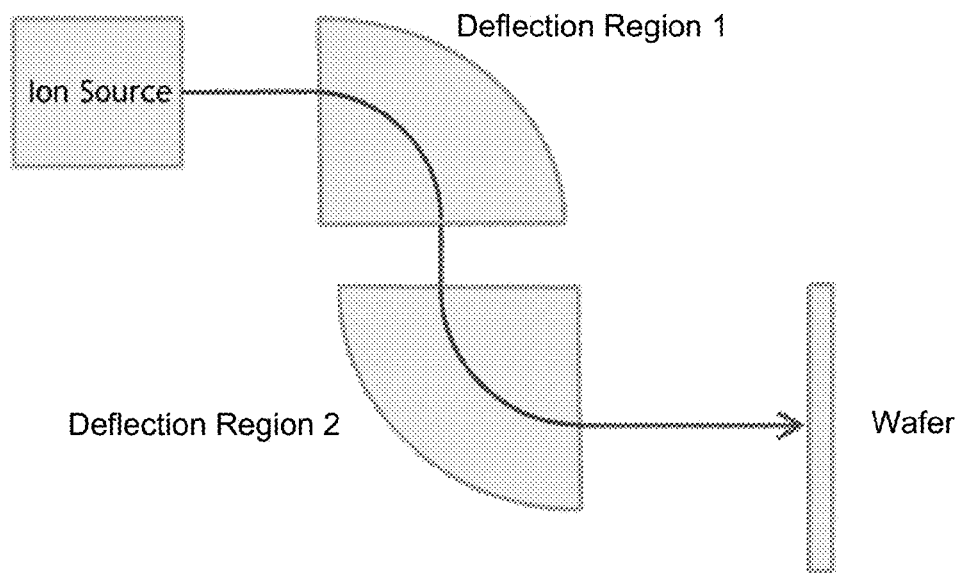
FIGS. 6A and 6B show an ion trajectory being tilted through the use of electrostatic and/or magnetic fields.
Figure 6B:
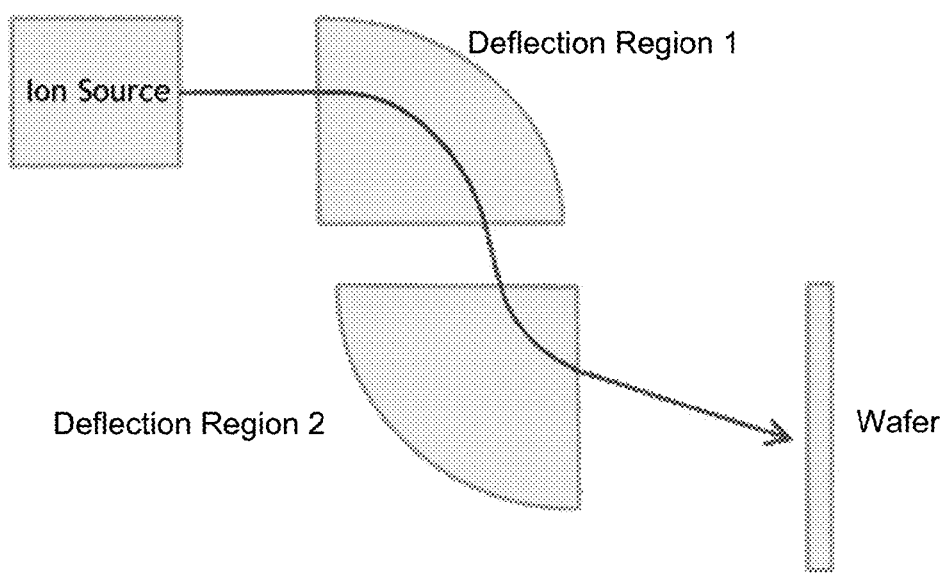

Alternatively the ion beam can be tilted with respect to the substrate in one direction, then tilted in another direction to complete the cycle. Various mechanical, electrical, magnetic, etc. mechanisms can be used to tilt the ion source direction. One method that may be used involves using one or more magnetic field to bend the ion trajectory as desired. In many cases, the ion trajectory is bent into an arc in the presence of a magnetic field. The bending radius of the ion trajectory is equal to mv/(qB), where m is the mass of the ion, v is the velocity of the ion, q is the charge of the ion, and B is the magnetic field strength. Thus, by varying the magnetic field strength and the region over which such fields are applied, the ion trajectory can be modified as desired to strike the substrate at particular incidence angles. In certain other embodiments, the ion trajectory is similarly altered through the use of an electrostatic field rather than a magnetic field. Similarly, a combination of magnetic and electrostatic fields can be used. FIGS. 6A and 6B show embodiments where magnetic and/or electrostatic fields are used to adjust the ion trajectory. In these embodiments, two deflection regions are used. In other embodiments, three or more deflection regions may be used, which may simplify certain issues related to optics. Compared to the embodiment of FIG. 6B, stronger fields are used in the embodiment of FIG. 6A, thus the ion trajectory is changed to a greater degree in each deflection region.

Whatever mechanism is used to orient the substrate or the ion beam, it should be capable of positioning the substrate with respect to the ion beam at desired tilt/rotation angles with a high degree of accuracy (e.g., tilt angle accuracy within about 5°, and rotational angle accuracy within about 5°). Such positional accuracy helps ensure that the channels are etched to a desired shape. In some cases, feedback may be used to control the angles at which the ions impact the substrate surface, as discussed further below.

In order to control the rotation angle, an indexing system may be used. Such a system may designate/define different angular locations on the substrate (e.g., 0°, 1°, . . . 359°), and track the rotation of the substrate according to these locations. The rotation may be tracked through optical means in some cases. For instance, a substrate holder may have a plurality of marks (e.g., 360 marks, each separated by 1° or less, though any suitable number of marks may be used) that can be tracked by an optical system as the substrate rotates. An optical encoder may be used in some cases. In other cases, a stepper motor is used to rotate the substrate. The stepper motor may rotate the substrate as described herein, carefully controlling the angular rotation of the substrate over time. A stepper motor may divide a full rotation into a number of equal steps (e.g., 360 steps, each separated by 1° or less, though any appropriate number of steps may be used). The motor's position, and therefore the angular position of the substrate holder and substrate, can be controlled to move between designated steps without the need for any feedback sensors. Other rotational indexing systems may also be used, so long as they allow the angular/rotational position to be accurately tracked at the relevant rotation speeds.

Figure 3D:
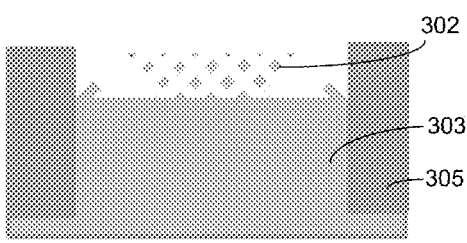
Figure 3E:
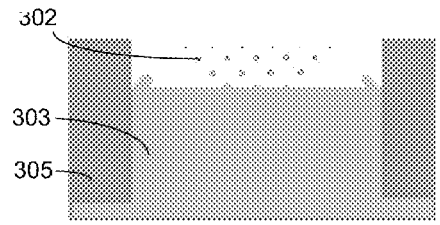

Returning to the process flow shown in FIGS. 3A-3I, the process continues at FIG. 3D. After the channels 302 are formed, the patterned mask layer 301 is removed. A number of different processes may be used to remove the patterned mask layer 301. In the embodiment shown in FIG. 3D, a selective etch is performed to remove the patterned mask layer 301 without removing (or minimally removing) the channels 302. This etch process may also etch the STI structures 305 to some degree, but such etching is minimal because the patterned mask layer 301 is removed quickly due to the small amount of material being removed. In another embodiment, the patterned mask layer 301 may be removed through chemical mechanical polishing (CMP) after a sacrificial material (e.g., silicon oxide) is deposited up to the height of the patterned mask layer 301.

In various embodiments it is desirable to form the channels 302 into a shape that is more round. Rounding the channels 302 helps remove portions of the channels that are especially likely to have received ion damage during etching. The channels may be rounded through exposure to a plasma treatment. The plasma treatment may involve isotropic etching through exposure to a fluorine-containing plasma in some cases. Other chemistries may also be used as appropriate. The channels may also be rounded through a process involving thermal oxidation of the channels 302, followed by removal of the resulting outer oxide material.

Figure 3F:
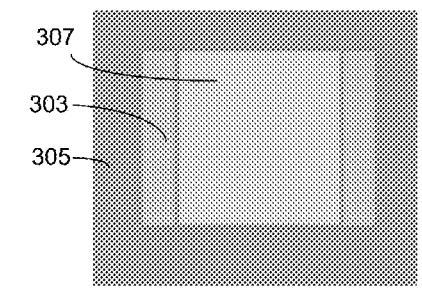
Figure 3G:
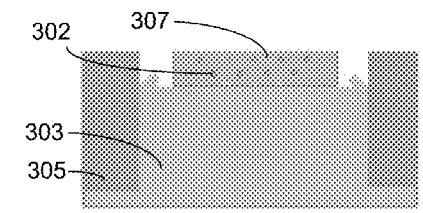
Figure 3H:
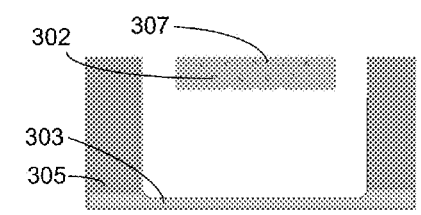
Figure 3I:
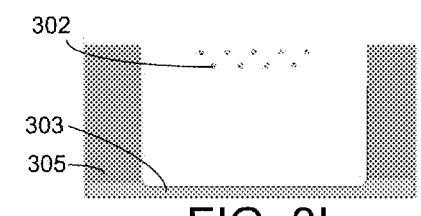

Next, a layer of sacrificial material 307 is deposited over the channels 302, as shown in FIGS. 3F (top-down view) and 3G (side view). The sacrificial material 307 may be flattened through CMP. The sacrificial material 307 can be any appropriate material that can be removed without removing the channels 302. In some cases the sacrificial material 307 is an oxide (e.g., silicon oxide), a nitride (e.g. silicon nitride) and in other cases the sacrificial material 307 is an organic material. Other materials may be used as appropriate. The purpose of the sacrificial material 307 is to protect the channels 302 while the semiconductor material 303 is etched away, as shown in FIG. 3H. The semiconductor material 303 is etched away such that there is some distance between the channels 302 and the underlying semiconductor material 303, and such that there is separation between adjacent devices (such separation being provided by STI structures 305). This etch is generally an isotropic etch. If the distance between the channels 302 and the semiconductor material 303 is too small, a gate (not shown) formed around the channels will experience the capacitance of the semiconductor material 303, which results in a higher than desired gate capacitance. As such, a distance between the lowermost row of channels and an underlying semiconductor layer may be at least about 50 nm. In some cases this distance is between about 100-1000 nm. After the semiconductor material 303 is etched back, the sacrificial material 307 may be removed, as shown in FIG. 3I. Often the sacrificial material is an oxide that is removed through an isotropic oxide etch.

The anisotropic etching process described in relation to FIGS. 3C and 4A-4D may be monitored and controlled through feedback in certain cases. For instance, incidence angle and beam divergence can both be subject to control through feedback. With regard to incident angle, position sensors on the substrate stage can be monitored and controlled at an accuracy between about ±3°, for example between about ±1° or ±0.1°. Beam divergence can be monitored and controlled by a beam divergence sensor located on the substrate stage. Beam divergence can be monitored and controlled to between about 4° FWHM, for example to about 1° FWHM. It is often beneficial to use relatively low energy ions such that the ion damage on the substrate (e.g., ion damage on the channels being formed) is minimized. Ion energies of 1000 eV or less may be needed to prevent excessive ion damage on the channels. Ion energy of 200 eV or less maybe needed for some damage sensitive devices, or 100 eV or less in some cases. With regard to the ion incidence angle, many different angles may be used. In some cases the incidence angles vary between about ±75°, for instance between about ±15°, or between about ±3°.

As mentioned above, the number of rows of channels that are created may be limited by the beam divergence, with less divergent (more highly collimated) beams being able to form greater numbers of rows of channels. Factors that affect ion beam divergence include the design of the plasma source used (e.g., the apertures on the electrodes and the biases applied to the electrodes) as well as energy of the ions in the ion beams. Low energy ions travel slower and therefore have a longer opportunity to spread themselves out due to repulsive forces, thus resulting in more divergent beams. Low energy ions are beneficial in so far as they result in less damage to the substrate. As such, there is a tradeoff regarding the optimal ion energy, with low energy ions resulting in less substrate damage but more divergent beams (which cannot create as many rows of channels).

Another factor that affects the number of rows of channels that can be created is the distance between the lower electrode and the substrate (e.g., the distance between electrode 113 and substrate 101 in FIG. 1). Generally, longer distances between the ion source and the substrate allow greater numbers of rows of channels to be created. In some cases, a distance between a lower surface of a lower electrode and the upper surface of a substrate is between about 5-50 cm, for example between about 10-20 cm. Unfortunately, larger separation distances also result in longer travel times for the ions. As mentioned, low energy ions can become repulsed from one another as they travel together in an ion beam, with this issue becoming more problematic at longer travel times/separation distances. One way to counteract this effect is to use higher energy/faster traveling ions and positively bias the substrate such that the ions initially travel fast and then slow as they approach the substrate. For instance, the lower electrode may be biased positively (e.g., at +1000 V) and the substrate may be biased slightly less positively (e.g., +995 V). The ions are relatively high energy ions and travel through most of the distance between the lower electrode and the substrate at a high speed, slowing at the end when they come near the substrate. This approach can help achieve a beam with low divergence that can be used to create several rows of channels.

FIGS. 5A-5G present an example process flow for forming a GAA structure. This process flow is described in Sleight, J. W. et. al., "Gate-all-around silicon nanowire MOSFETs and circuits," *Device Research Conference* (*DRC*), 2010, pp. 269-272, 21-23 Jun. 2010. In various embodiments herein, a different but similar process flow is used to form a GAA device, as described with respect to FIGS. 3A-3G and 4A-4D. In particular, the ion beam etching process and related process flow described above may be used to form channels (or an array of channels), to arrive at a structure similar to that of FIG. 5C. The remaining operations shown in FIGS. 5D-5G (or another process flow) may then be undertaken to form a complete GAA structure.

Figure 5A:
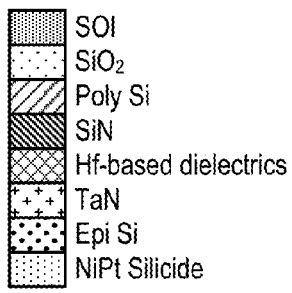
FIGS. 5A-5G illustrate certain processing steps for forming a gate-all-around device.
Figure 5A:
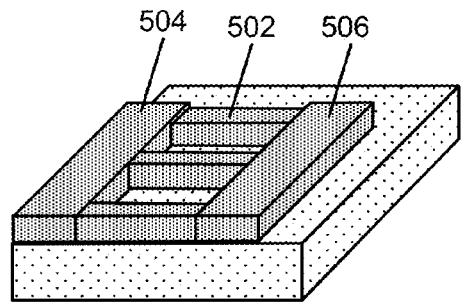
Figure 5B:
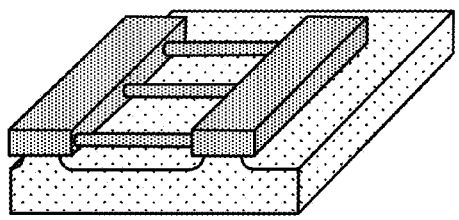
Figure 5C:
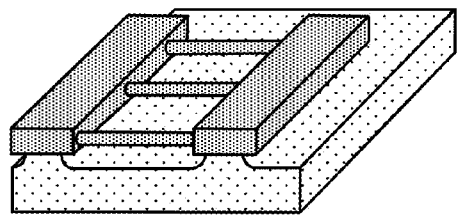

In FIG. 5A, silicon nanowires 502 (which eventually act as channels) are defined between regions 504 and 506 (which eventually act as a source region and a drain region, respectively). In FIG. 5B, a maskless thinning/smoothing step involving an $H_2$ anneal is undertaken to thin the nanowires 502. In FIG. 5C, the nanowires 502 are further reduced in size through an oxidation operation. At this point, the partially fabricated device includes three nanowires 502, which will act as channels in the finished device. In various embodiments herein, a method involving ion beam etching using particular angles of ion impact is used to form a structure that resembles that shown in FIG. 5C, as described above. In many cases, an array of wires/channels are formed. Then, in order to form a GAA device, the structure formed through the disclosed methods may be further processed as shown in FIGS. 5D-5G. Of course, other processing methods may be used as appropriate, and the disclosed embodiments are not limited to a particular process flow for forming the overall GAA structure.

Figure 5D:
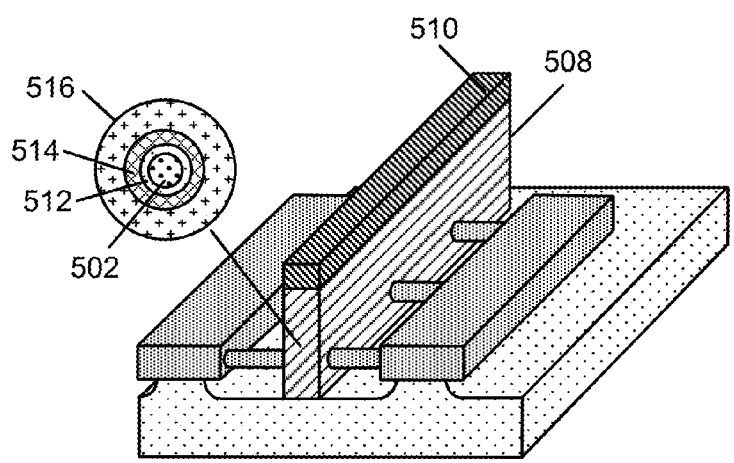
Figure 5E:
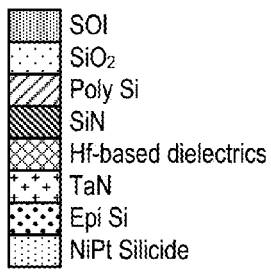
Figure 5E:
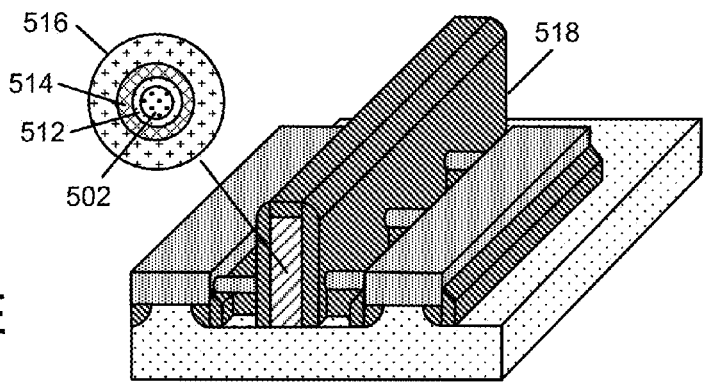
Figure 5F:
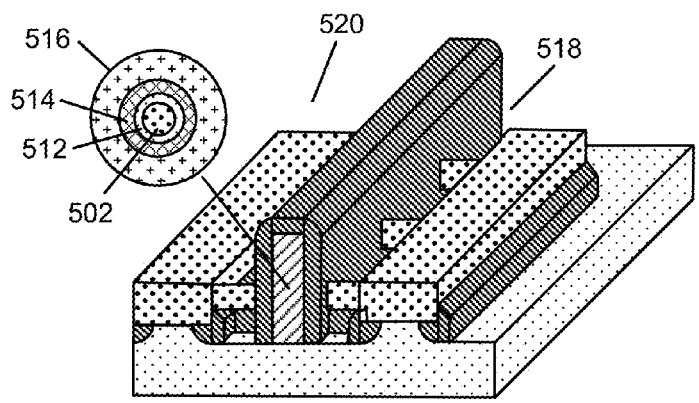
Figure 5G:
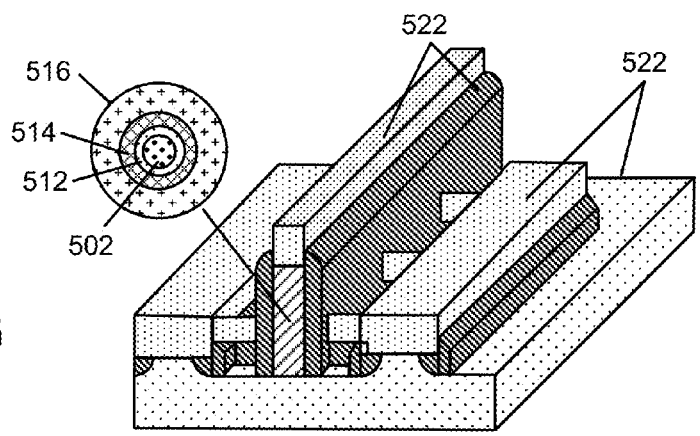

Returning to the embodiment of FIGS. 5A-5G, in FIG. 5D the nanowires 508 are coated with various dielectric materials 512, 514, and 516, and the gate 508 is defined. The dielectric materials 512, 514, and 516 are provided to prevent direct physical contact between the nanowires 508 and the gate 508. In this example, the nanowires 502 are coated with silicon oxide 512 (e.g., silicon dioxide), which is coated with Hf-based dielectric material 514, which is coated with tantalum nitride 516. The gate 508 is capped by a cap layer 510. The gate 508 may be made of poly silicon, and the cap layer 510 may be made of silicon nitride, for instance. Next, in FIG. 5E, a spacer layer 518 is formed. The spacer layer 518 may be silicon nitride for example. Then, as shown in FIG. 5F, epitaxial silicon 520 is formed over the regions 504 and 506, where the source and drain are formed. The epitaxial silicon 520 also forms over exposed regions of the nanowires 502, making the nanowires thicker in regions outside of the gate 508. The increased thickness helps decrease the resistance through the wires 502. Next, silicide 522 is formed on various regions as shown in FIG. 5G. The process steps from silicide formation to the first metal level are omitted, though such steps are familiar to those of ordinary skill in the art. In various embodiments, a layer or array of channels formed as described above are further processed as shown in FIGS. 5D-5G to form a gate-all-around device.

Apparatus and System Controller

The methods described herein may be performed by any suitable apparatus. A suitable apparatus includes hardware for accomplishing the process operations and a system controller having instructions for controlling process operations in accordance with the present invention. An example apparatus is shown in FIG. 1. In some embodiments, the hardware may include one or more process stations included in a process tool.

In some embodiments, a system controller (which may include one or more physical or logical controllers) controls some or all of the operations of a process tool. The system controller will typically include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing, mixture of electrolyte components, inlet pressure, plating cell pressure, plating cell temperature, wafer temperature, current and potential applied to the wafer and any other electrodes, wafer position, wafer rotation, wafer immersion speed, and other parameters of a particular process performed by the process tool. System control software may be configured in any suitable way. For example, various process tool component subroutines or control objects may be written to control operation of the process tool components necessary to carry out various process tool processes. System control software may be coded in any suitable computer readable programming language.

In some embodiments, system control software includes input/output control (IOC) sequence instructions for controlling the various parameters described above. For example, each phase of an electroplating process may include one or more instructions for execution by the system controller. The instructions for setting process conditions for an immersion process phase may be included in a corresponding immersion recipe phase. In some embodiments, the electroplating recipe phases may be sequentially arranged, so that all instructions for an electroplating process phase are executed concurrently with that process phase.

Other computer software and/or programs may be employed in some embodiments. Examples of programs or sections of programs for this purpose include a substrate positioning program, an electrolyte composition control program, a pressure control program, a heater control program, and a potential/current power supply control program.

In some cases, the controllers control one or more of the following functions: wafer positioning (translation, tilt, rotation), ion beam voltage, ion beam divergence, electron flood gun parameters, etc. The wafer positioning may be controlled by, for example, directing the wafer lift assembly, wafer tilt assembly and wafer rotation assembly to move as desired. The controller may control the voltages on the electrodes to control ion voltage, and ion focus. The controllers may control these aspects based on sensor output (e.g., when current, current density, potential, pressure, etc. reach a certain threshold), the timing of an operation (e.g., opening valves at certain times in a process) or based on received instructions from a user.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of forming channels or nanowires for a gate-all-around device or other electronic device, the method comprising:
   (a) providing a substrate on a substrate holder in a reaction chamber, the substrate comprising a patterned mask layer over semiconductor material, wherein the patterned mask layer comprises a plurality of linear mask portions oriented substantially parallel to one another;
   (b) orienting the substrate with respect to an ion trajectory in a first orientation and directing ions toward the substrate in a first direction, wherein the ions impact the substrate at a first incidence angle to thereby anisotropically etch the semiconductor material to form a first set of trenches;
   (c) orienting the substrate with respect to the ion trajectory in a second orientation and directing ions toward the substrate in a second direction, wherein the ions impact the substrate at a second incidence angle to thereby anisotropically etch the semiconductor material to form a second set of trenches;
   (d) repeating (b)-(c) to further etch the first and second sets of trenches to form the channels or nanowires in a direction parallel to the plurality of linear mask portions; and
   (e) forming the gate-all-around device, wherein the channels or nanowires formed in (a)-(c) are channels or nanowires in the gate-all-around device.

2. The method of claim 1, wherein an array of channels or nanowires is formed, the array comprising at least two rows of channels or nanowires.

3. The method of claim 1, wherein the ions are delivered in the form of a plurality of ion beams that have a divergence of about 3° or less.

4. The method of claim 3, wherein the ions are delivered in the form of a plurality of ion beams that have a divergence of about 1° or less, and wherein an array of channels or nanowires is formed, the array comprising at least three rows of channels or nanowires.

5. The method of claim 1, further comprising translating the substrate while the ions are exposed to the substrate in (b) and (c).

6. The method of claim 1, further comprising ceasing the flux of the ions while the orientation of the substrate with respect to the ion trajectory is switched.

7. The method of claim 1, wherein the first direction and second direction are each perpendicular to the length of the linear mask portions.

8. The method of claim 7, wherein the first direction and second direction are substantially opposite one another.

9. The method of claim 8, wherein the first and second incidence angles are substantially equal and opposite one another.

10. The method of claim 1, further comprising delivering a reactive etchant to the surface of the substrate during (b) and during (c).

11. The method of claim 10, wherein the reactive etchant comprises a gas selected from the group consisting of $H_2$, $O_2$, $H_2O$, $F_2$, $CH_4$, $CF_4$, $C_2F_6$, $BF_3$, $NH_3$, $NO$, $NO_2$, $SF_6$, $N_2$, $N_2O$, $BCl_3$, $CHF_3$, $CH_2F_2$, $C_2H_4Cl_2$, HCl, $Cl_2$, $Br_2$, HBr, methanol, ethanol, propanol, butanol, methylene glycol, ethylene glycol, acetylacetone, acetic acid, formic acid, hexafluoroacetylacetone, ketones, amines, esters, and combinations thereof.

12. The method of claim 10, wherein the reactive etchant is provided along with an inert gas, and wherein the inert gas is used to generate a plasma from which the ions are extracted.

13. The method of claim 10, wherein (b) and (c) each comprise cyclically performing the steps of: delivering the reactive etchant to the surface of the substrate, and exposing the surface of the substrate to the ions.

14. The method of claim 13, wherein at least two cycles of reactant delivery and ion exposure are performed each time the orientation of the substrate with respect to the ion trajectory is switched.

15. The method of claim 10, wherein the reactive etchant comprises ions of a material selected from the group consisting of: H, O, F, Cl, Br, I, $BF_2$, $BCl_2$, and combinations thereof.

16. The method of claim 1, wherein the orientation of the substrate with respect to the ion trajectory is switched at least about 2 times during formation of the channels or nanowires.

17. The method of claim 1, further comprising after (d), etching the channels or nanowires to make the channels or nanowires more round.

18. The method of claim 17, further comprising removing the patterned mask layer; depositing sacrificial material surrounding the channels or nanowires; performing an isotropic etch to remove additional semiconductor material positioned under the channels or nanowires, and performing an etch to remove the sacrificial material surrounding the channels or nanowires.

19. The method of claim 18, further comprising after the sacrificial material is removed, depositing dielectric material to coat the channels or nanowires, and depositing a gate structure around the coated channels or nanowires to form a gate-all-around device.

20. The method of claim 1, wherein orienting the substrate with respect to the ion trajectory in (b) and/or (c) comprises (i) changing the orientation of the substrate, and/or (ii) changing the orientation of the ion trajectory.

21. The method of claim 1, wherein an array of channels or nanowires is formed, the array comprising at least three rows of channels or nanowires.

22. A method of forming channels or nanowires for a gate-all-around device or other electronic device, the method comprising:
(a) providing a substrate on a substrate holder in a reaction chamber, the substrate comprising a patterned mask layer over semiconductor material, wherein the patterned mask layer comprises a plurality of linear mask portions oriented substantially parallel to one another;
(b) orienting the substrate with respect to an ion trajectory in a first orientation and directing ions toward the substrate in a first direction, wherein the ions impact the substrate at a first incidence angle to thereby anisotropically etch the semiconductor material to form a first set of trenches;
(c) orienting the substrate with respect to the ion trajectory in a second orientation and directing ions toward the substrate in a second direction, wherein the ions impact the substrate at a second incidence angle to thereby anisotropically etch the semiconductor material to form a second set of trenches; and
(d) repeating (b)-(c) to further etch the first and second sets of trenches to form the channels or nanowires in a direction parallel to the plurality of linear mask portions, wherein the ions are delivered in the form of a plurality of ion beams that have a divergence of about 1° or less, and wherein an array of channels or nanowires is formed, the array comprising at least three rows of channels or nanowires.

23. The method of claim 22, wherein an array of channels or nanowires is formed, the array comprising at least two rows of channels or nanowires.

24. The method of claim 22, further comprising translating the substrate while the ions are exposed to the substrate in (b) and (c).

25. The method of claim 22, further comprising ceasing the flux of the ions while the orientation of the substrate with respect to the ion trajectory is switched.

26. A method of forming channels or nanowires for a gate-all-around device or other electronic device, the method comprising:
(a) providing a substrate on a substrate holder in a reaction chamber, the substrate comprising a patterned mask layer over semiconductor material, wherein the patterned mask layer comprises a plurality of linear mask portions oriented substantially parallel to one another;
(b) orienting the substrate with respect to an ion trajectory in a first orientation and directing ions toward the substrate in a first direction, wherein the ions impact the substrate at a first incidence angle to thereby anisotropically etch the semiconductor material to form a first set of trenches;
(c) orienting the substrate with respect to the ion trajectory in a second orientation and directing ions toward the substrate in a second direction, wherein the ions impact the substrate at a second incidence angle to thereby anisotropically etch the semiconductor material to form a second set of trenches;
(d) repeating (b)-(c) to further etch the first and second sets of trenches to form the channels or nanowires in a direction parallel to the plurality of linear mask portions; and
(e) after (d), etching the channels or nanowires to make the channels or nanowires more round.

27. The method of claim 26, wherein an array of channels or nanowires is formed, the array comprising at least two rows of channels or nanowires.

28. The method of claim 26, further comprising translating the substrate while the ions are exposed to the substrate in (b) and (c).

29. The method of claim 26, further comprising ceasing the flux of the ions while the orientation of the substrate with respect to the ion trajectory is switched.

* * * * *